(12) United States Patent
Werking

(10) Patent No.: US 6,709,954 B1
(45) Date of Patent: Mar. 23, 2004

(54) SCRIBE SEAL STRUCTURE AND METHOD OF MANUFACTURE

(75) Inventor: James D. Werking, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/177,336

(22) Filed: Jun. 21, 2002

(51) Int. Cl.[7] ............................................. H01L 21/46
(52) U.S. Cl. ...................... 438/460; 438/465; 438/114
(58) Field of Search ................................. 438/106, 113, 438/114, 115, 460, 462, 465, 622, 758

(56) References Cited

U.S. PATENT DOCUMENTS

| | | | |
|---|---|---|---|
| 5,933,758 A | 8/1999 | Jain | 438/687 |
| 6,022,791 A | * 2/2000 | Cook et al. | 438/458 |
| 6,078,068 A | 6/2000 | Tamura | 257/203 |
| 6,268,289 B1 | 7/2001 | Chowdhury et al. | 438/687 |
| 6,300,223 B1 | 10/2001 | Chang et al. | 438/460 |
| 6,326,301 B1 | 12/2001 | Venkatesan et al. | 438/638 |
| 6,365,958 B1 | 4/2002 | Ibnabdeljalil et al. | 257/620 |
| 6,412,786 B1 | * 7/2002 | Pan | 277/630 |

\* cited by examiner

Primary Examiner—Tuan H. Nguyen
(74) Attorney, Agent, or Firm—The Cavanagh Law Firm

(57) ABSTRACT

A scribe seal (22) and a method for manufacturing the scribe seal (22) and a semiconductor component including the scribe seal (22). A semiconductor substrate (24) has a major surface (26) and a crack arrest structure (36) formed on the major surface (26). A dielectric material (30) is formed on a portion of the semiconductor substrate (24) adjacent the crack arrest structure (36). A nitride layer (38) is formed on the crack arrest structure (36) and the dielectric material (30). An oxide layer (40) is formed on the nitride layer (38). An opening (42) is formed in the oxide layer (40) and the nitride layer (38) and lands on and exposes a portion of the dielectric material (30). A crack arrest material such as, for example, copper, is formed in the opening (42). A semiconductor device is formed in the semiconductor substrate (24).

9 Claims, 8 Drawing Sheets

-PRIOR ART-

SCRIBE SEAL STRUCTURE AND METHOD OF MANUFACTURE

FIELD OF THE INVENTION

This invention relates, in general, to semiconductor components and, more particularly, to scribe seal structures on semiconductor components.

BACKGROUND OF THE INVENTION

Typically, a plurality of semiconductor components are manufactured from a single semiconductor wafer. The semiconductor wafer is partitioned into a plurality of rectangular regions called die or chips, where adjacent chips are separated by scribe lines. The manufacturing process is designed so all the chips on a single semiconductor wafer are identical. Once the transistor circuitry and associated metal interconnects have been fabricated in the chip active region, the semiconductor wafers are sawed along the scribe lines to separate or singulate the semiconductor wafer into a plurality of semiconductor chips. The chips are then packaged, tested, and shipped to customers.

Sawing or cutting the semiconductor wafer stresses it and causes microcracking to occur. The microcracks can migrate to the active regions of the chips and damage the circuitry fabricated in the semiconductor wafer. To prevent or arrest microcrack migration, designers place scribe seal structures between the active region of the chip and the scribe lines. These structures prevent microcracks formed during sawing along the scribe lines from migrating to the active region, thereby preventing the microcracks from damaging the semiconductor components.

FIG. 1 illustrates an enlarged cross-sectional view of a scribe seal structure 100 in accordance with the prior art. Scribe seal structure 100 comprises a semiconductor substrate 102 having a dielectric layer 104 disposed thereon. Dielectric layer 104 has an opening 106 filled with copper that forms a copper layer 108. A capping layer 110 is disposed on dielectric layer 104 and copper layer 108. A dielectric layer 112 having a plurality of openings 114 is disposed on capping layer 110. Openings 114 extend through capping layer 110 and expose portions of copper layer 108. Openings 114 are filled with copper to form copper-filled vias 115. A dielectric layer 116 having an opening 118 is formed on dielectric layer 112 and copper-filled vias 115. Opening 118 is filled with copper that forms a copper layer 120. A capping layer 124 is disposed on dielectric layer 116 and copper layer 120. A dielectric layer 126 having a plurality of openings 128 is disposed on capping layer 124. Openings 128 extend through capping layer 124 and expose portions of copper layer 120. Openings 128 are filled with copper to form copper-filled vias 129. A dielectric layer 132 having an opening 134 is formed on dielectric layer 126 and copper-filled vias 129. Opening 134 is filled with copper that forms a copper layer 135. A capping layer 136 is disposed on dielectric layer 132 and copper layer 135. A dielectric layer 137 having a plurality of openings 138 is disposed on capping layer 136. Openings 138 extend through capping layer 136 and expose portions of copper layer 135. Openings 138 are filled with copper to form copper-filled vias 139. A dielectric layer 140 having an opening 141 is formed on dielectric layer 137 and copper-filled vias 139. Opening 141 is filled with copper that forms a copper layer 142. A capping layer 144 is disposed on dielectric layer 140 and copper layer 142. A drawback of scribe seal structure 100 is that openings 114, 128, and 138 are formed using Reactive Ion Etching (RIE) that terminates on copper. Because these openings terminate on copper, the RIE causes sputtering of the copper from copper layers 108, 120, and 135, that are exposed by openings 114, 128, and 138, respectively. As those skilled in the art are aware, copper is a silicon contaminant. Thus, the sputtered copper contaminates the silicon substrate which leads to device failure.

Accordingly, what is needed is method and structure for forming scribe seals that does not cause copper to be sputtered.

SUMMARY OF THE INVENTION

The present invention satisfies the foregoing need by providing a scribe seal, a method for fabricating the scribe seal, and a semiconductor component including the scribe seal. In accordance with one aspect of the present invention, the scribe seal comprises a semiconductor substrate having a crack arrest structure disposed on a first portion of a major surface. A dielectric layer is disposed on a second portion of the major surface, where the dielectric layer is adjacent the crack arrest structure. Another crack arrest structure is disposed on the dielectric layer that is disposed on the major surface. This crack arrest structure is laterally spaced apart from the crack arrest structure disposed on the major surface. The crack arrest structures cooperate to form a scribe seal.

In accordance with another aspect, the present invention includes a method for manufacturing a scribe seal. A semiconductor substrate having a major surface is provided. A layer of dielectric material is disposed on a portion of the major surface and an opening is formed in the layer of dielectric material to expose a portion of the major surface. The opening is filled with a crack arresting material to form a crack arrest structure. A layer of dielectric material is formed on the crack arresting material and the layer of dielectric material disposed on the major surface. An opening is formed in the second layer of dielectric material, which opening exposes a portion of the first layer of dielectric material. The opening in the second layer of dielectric material is filled with crack arresting material to form a crack arrest structure. The crack arrest structures cooperated to form a scribe seal.

In accordance with yet another aspect, the present invention includes a semiconductor component having a scribe seal in accordance with an embodiment of the present invention.

BRIEF DESCRIPTION OF THE DRAWINGS

The present invention will be better understood from a reading of the following detailed description, taken in conjunction with the accompanying drawing figures in which like references designate like elements and in which.

DETAILED DESCRIPTION

Generally, the present invention provides a scribe seal, a method for fabricating the scribe seal, and a semiconductor component including the scribe seal. A scribe seal is also referred to as a scribe seal structure. The scribe seal is fabricated by forming a metal layer and a dielectric layer on a semiconductor substrate. A layer of a first type of dielectric material, e.g., nitride, is formed on the metal layer and the dielectric layer disposed on the semiconductor substrate. A layer of a second type of dielectric material, e.g., oxide, is formed on the nitride layer. Vias are etched in the oxide and nitride dielectric layers using a dry etch, wherein the dry etch is terminated in the dielectric material disposed on the semiconductor substrate. The copper-filled vias and the oxide are covered with a nitride or nitride-like capping layer. Additional levels of metallization can be formed, wherein vias are formed using a dry etch and filled with a material such as, for example, copper. Because the dry etch is terminated on a dielectric material, rather than copper, copper sputtering and subsequent copper contamination does not occur.

Figure 1:
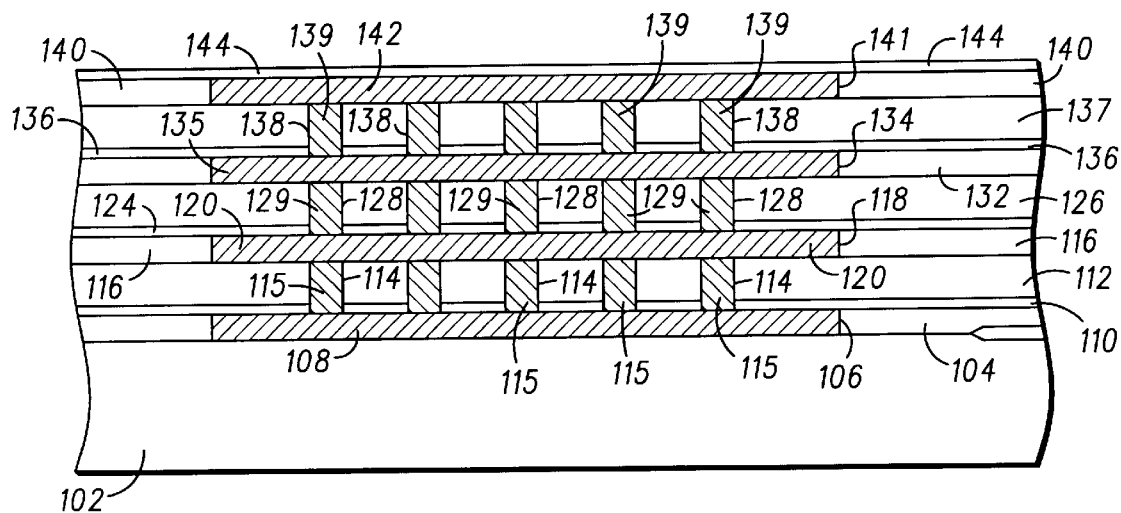
FIG. 1 is a cross-sectional side view of a prior art scribe seal.
Figure 2:
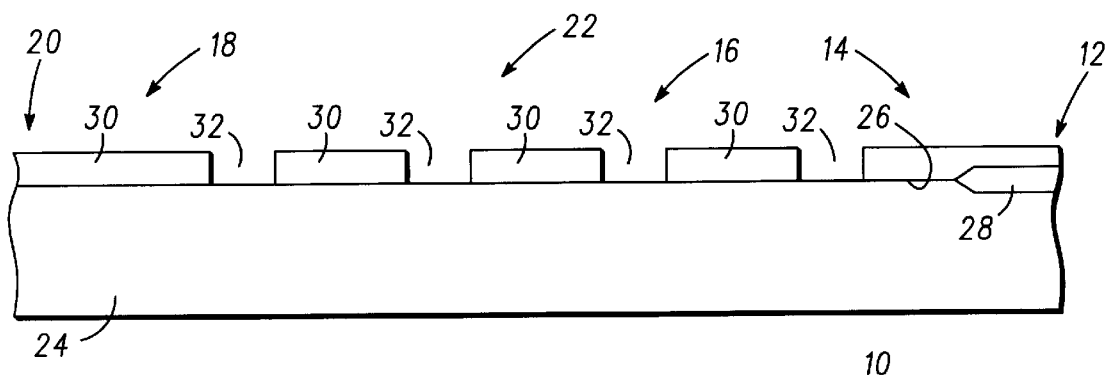
FIGS. 2–11 are cross-sectional side views of a scribe seal during fabrication in accordance with an embodiment of the present invention.

FIG. 2 is an enlarged cross-sectional side view of a portion of a semiconductor component 10 having an active device region 12, a buffer area 14, a scribe seal region 16, a buffer area 18, and a scribe line 20. It should be understood that the description of the fabrication or processing steps will focus on the formation of a scribe seal 22 in scribe seal region 16; however, other portions of a semiconductor component, e.g., an insulated gate field effect transistor or a bipolar junction transistor, can be manufactured contemporaneously with the scribe seal. Scribe seal region 16 of semiconductor component 10 is formed from a semiconductor substrate 24 having a major surface 26. Suitable material for semiconductor substrate 24 includes silicon, silicon germanium, germanium, gallium arsenide, indium phosphide, Silicon-On-Insulator (SOI), and the like. The semiconductor material may also be a semiconductor substrate having an epitaxial layer formed thereon. Further, the conductivity type of substrate 24 is not a limitation of the present invention. In accordance with the present embodiment, the conductivity type may be chosen to form an n-channel insulated gate semiconductor device, a p-channel insulated gate semiconductor device, a complementary insulated gate semiconductor device, e.g., a Complementary Metal Oxide Semiconductor (CMOS) device, a bipolar junction transistor, an insulated gate bipolar transistor, combinations thereof, and the like. Also shown in FIG. 2, is an oxide isolation structure 28 that separates active device region 12 from buffer region 14. Although isolation structure 28 is shown as an oxide formed by Local Oxidation of Silicon, i.e., a LOCOS structure, other suitable isolation structures can be used, such as, for example, a trench isolation structure.

Still referring to FIG. 2, a layer of dielectric material 30 is deposited on major surface 26. By way of example, dielectric layer 30 is formed by decomposition of silane. The technique for forming dielectric layer 30 is not a limitation of the present invention. For example, dielectric layer 30 can be formed by decomposition of tetraethylorthosilicate (TEOS), chemical vapor deposition, and the like. By way of example, dielectric layer 30 has a thickness ranging between approximately 150 Angstroms (Å) and approximately 8,000 Å. A layer of photoresist (not shown) is patterned on dielectric layer 30 to expose portions of dielectric layer 30. The exposed portions of dielectric layer 30 are removed using a reactive ion etch to form openings 32 that expose surface 26. After openings 32 have been formed, the layer of photoresist is removed.

Figure 3:
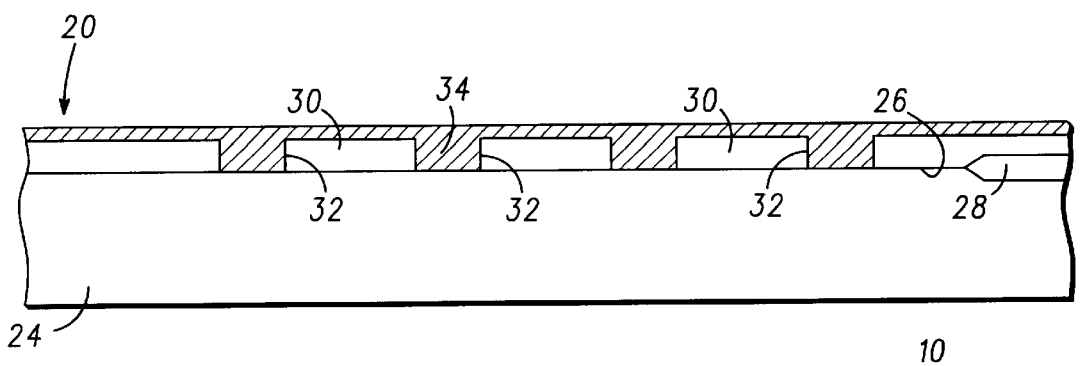

Now referring to FIG. 3, a layer of metal 34 is deposited on dielectric layer 30 and fills openings 32. Suitable metals include copper, aluminum, silver, tungsten, tantalum, and the like. Preferably, metal layer 34 is copper.

Figure 4:
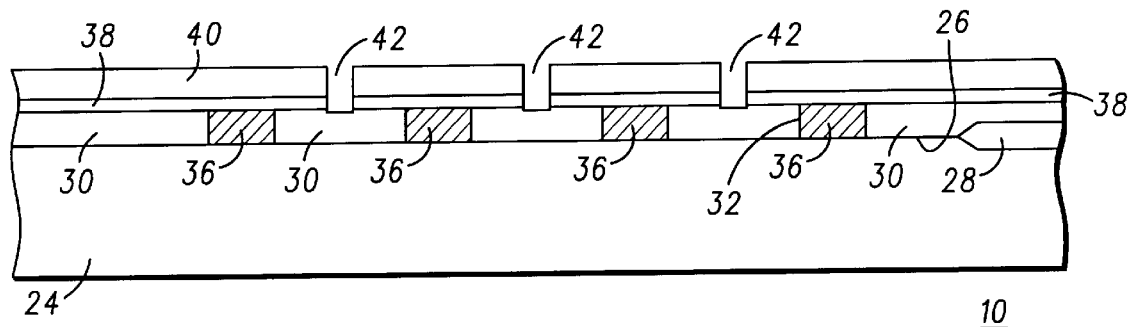

Now referring to FIG. 4, copper layer 34 is planarized using, for example, a Chemical Mechanical Planarization (CMP) technique to remove the portions of copper layer 34 formed on dielectric layer 30. The portions of copper layer 34 filling openings 32 remain and form crack arrest structures 36. Crack arrest structures 36 are also referred to as stress-defect inhibitors. A layer of dielectric material 38 is formed on dielectric layer 30 and crack arrest structures 36. Preferably dielectric layer 38 is silicon nitride or the like having a thickness ranging between approximately 15 Å and approximately 800 Å. Nitride layer 38 serves as a capping layer for crack arrest structures 36. A layer of dielectric material 40 is formed on nitride layer 38. By way of example, dielectric layer 40 has a thickness ranging between approximately 150 Å and approximately 8,000 Å. It should be understood that the types of material for dielectric layers 30, 38, and 40 are selected such that a layer of one type of dielectric material is sandwiched between layers of a different type dielectric material. In other words, the dielectric material of layers 30 and 40 are preferably the same, e.g., oxide, and the dielectric material of layer 38 is a different type of dielectric material, e.g., nitride.

A layer of photoresist (not shown) is patterned on dielectric layer 40 to expose portions of dielectric layer 40. The exposed portions of dielectric layer 40 are removed using a reactive ion etch to form openings 42. Openings 42 extend through oxide layer 40, nitride layer 38, and into oxide layer 30. After removing the portions of oxide layer 40 to form openings 42, the etch chemistry of the reactive ion etch is changed to be selective to nitride, rather than oxide. However, once openings 42 extend through nitride layer 38, the etch chemistry is still capable of etching oxide. Thus, once openings 42 extend through nitride layer 38, the etch continues so that openings 42 extend into oxide layer 30. Because openings 42 terminate on oxide, rather than copper, the formation of openings 42 does not result in the sputtering of copper. This is advantageous because sputtered copper would contaminate the reactive ion etch chamber as well as the semiconductor component.

Figure 5:
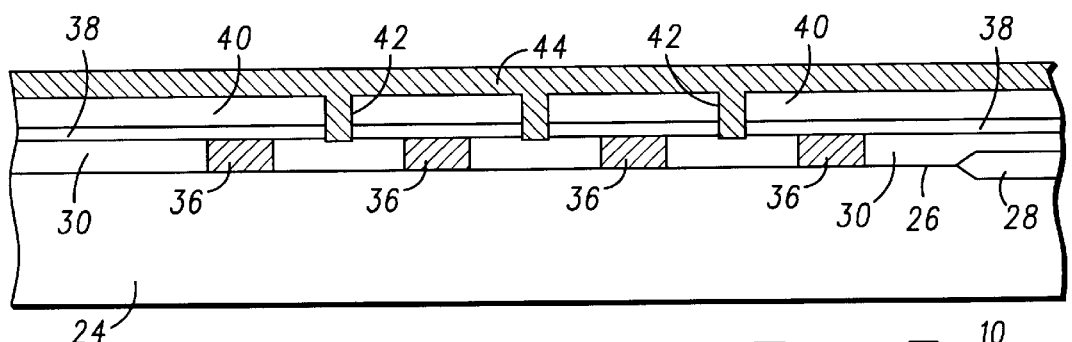

Now referring to FIG. 5, a layer of metal 44 is deposited on dielectric layer 40 and fills openings 42. Suitable metals include copper, aluminum, and the like. Preferably, metal layer 44 is copper.

Figure 6:
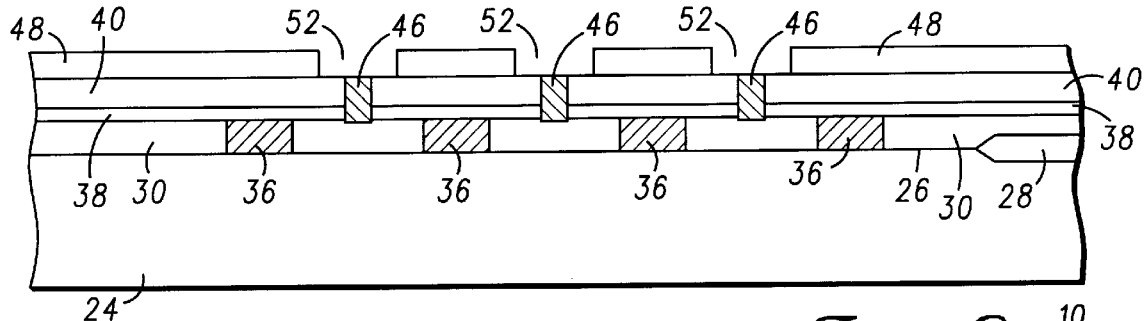

Now referring to FIG. 6, copper layer 44 is planarized using, for example, a CMP technique to remove the portions of copper layer 44 formed on dielectric layer 40. The portions of copper layer 44 filling openings 42 remain and form portions 46 of crack arrest structures or stress-defect inhibitors 51. Crack arrest structures 51 are further shown and described with reference to FIG. 7. A layer of dielectric material 48 is formed on dielectric layer 40. Preferably, the material of dielectric layer 48 is the same as the material of dielectric layer 40, e.g., oxide. By way of example, dielectric layer 48 has a thickness ranging between approximately 150 Å and approximately 8,000 Å. A layer of photoresist (not shown) is patterned on dielectric layer 48 to expose portions of dielectric layer 48. The exposed portions of dielectric layer 48 are removed using either a wet etch or a dry etch to form openings 52 that expose portions 46 of the crack arrest structure and the portions of oxide layer 40 that are adjacent to portions 46 of crack arrest structures 51. After openings 52 have been formed, the layer of photoresist is removed.

Figure 7:
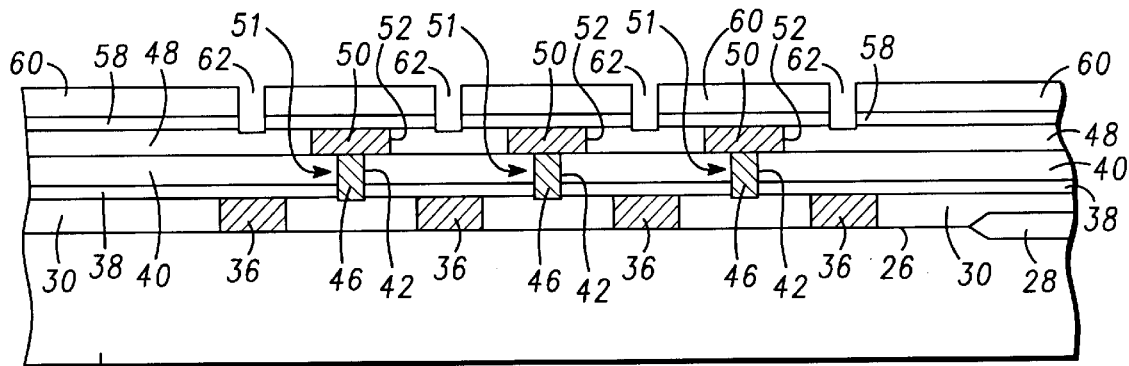

Now referring to FIG. 7, a layer of metal (not shown) is deposited on dielectric layer 48 and fills openings 52.

Suitable metals include copper, aluminum, and the like. Preferably, the metal layer is copper. The copper layer is planarized using, for example, a CMP technique to remove the portions of the copper layer formed on dielectric layer 48. The portions of the copper layer filling openings 52 remain and form a portion 50 of crack arrest structure 51 or stress-defect inhibitor. Portions 46 and 50 cooperate to form crack arrest structures 51. A layer of dielectric material 58 is formed on dielectric layer 48 and portions 50 of crack arrest structures 51. Preferably dielectric layer 58 is silicon nitride or the like having a thickness ranging between approximately 15 Å and approximately 800 Å. Silicon nitride layer 58 serves as a capping layer for crack arrest structures 51. A layer of dielectric material 60 is formed on nitride layer 58. By way of example, dielectric layer 60 has a thickness ranging between approximately 150 Å and approximately 8,000 Å. It should be understood that the types of material for dielectric layers 48, 58, and 60 are selected such that a layer of one type dielectric material is sandwiched between layers of a different type dielectric material. In other words, the dielectric material of layers 48 and 60 are preferably the same, e.g., oxide, and the dielectric material of layer 58 is a different type of dielectric material, e.g., nitride.

A layer of photoresist (not shown) is patterned on dielectric layer 60 to expose portions of dielectric layer 60. The exposed portions of dielectric layer 60 are removed using a reactive ion etch to form openings 62. Openings 62 extend through oxide layer 60, nitride layer 58 and into oxide layer 48. After removing the portions of oxide layer 60 to form openings 62, the etch chemistry of the reactive ion etch is changed to be selective to nitride, rather than oxide. However, once openings 62 extend through nitride layer 58, the etch chemistry is still capable of etching oxide. Thus, once openings 62 extend through nitride layer 58, the etch continues so that openings 62 extend into oxide layer 48. Because openings 62 terminate on oxide, rather than copper, the formation of openings 62 does not result in the sputtering of copper.

Figure 8:
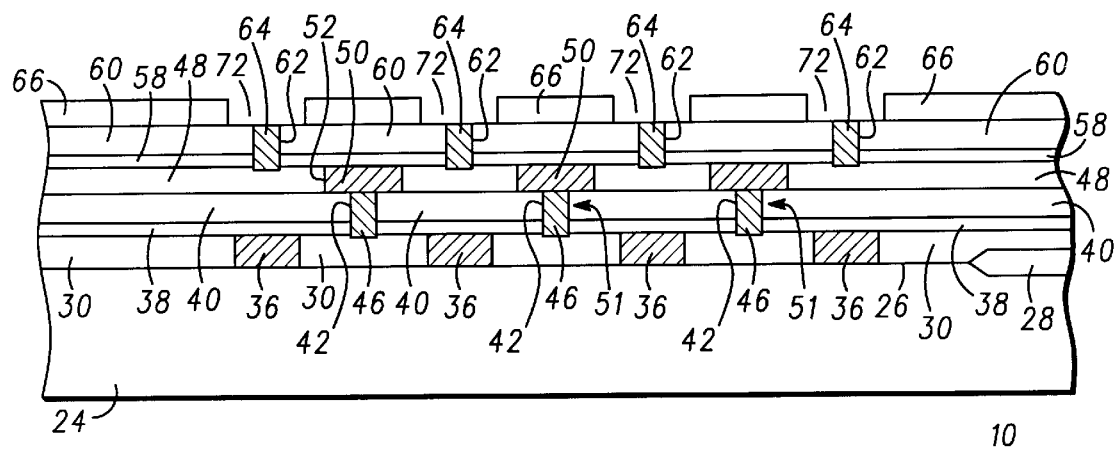

Now referring to FIG. 8, a layer of metal (not shown) is deposited on dielectric layer 60 and fills openings 62. Suitable metals include copper, aluminum, and the like. Preferably, the metal layer is copper. The copper layer is planarized using, for example, a CMP technique to remove the portions of the copper layer formed on dielectric layer 60. The portions of the copper layer filling openings 62 remain and form portions 64 of crack arrest structures or stress-defect inhibitors 68. Crack arrest structures 68 are further shown and described with reference to FIG. 9. A layer of dielectric material 66 is formed on dielectric layer 60. Preferably, the material of dielectric layer 66 is the same as the material of dielectric layer 60, e.g., oxide. By way of example, dielectric layer 66 has a thickness ranging between approximately 150 Å and approximately 8,000 Å. A layer of photoresist (not shown) is patterned on dielectric layer 66 to expose portions of dielectric layer 66. The exposed portions of dielectric layer 66 are removed using either a wet etch or a dry etch to form openings 72 that expose portions 64 of crack arrest structures 68 and portions of oxide layer 60 that are adjacent to portions 64 of crack arrest structures 68. After openings 72 have been formed, the layer of photoresist is removed.

Figure 9:
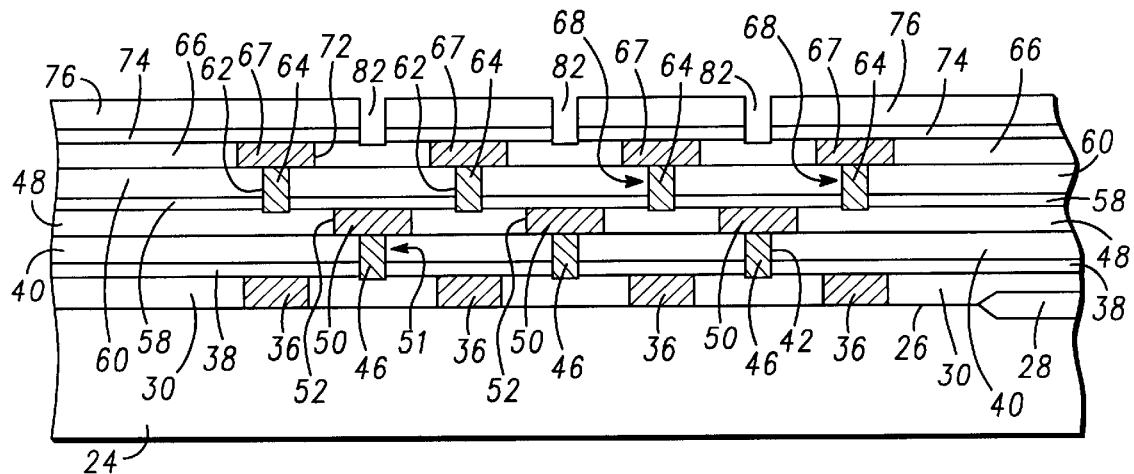

Now referring to FIG. 9, a layer of metal (not shown) is deposited on dielectric layer 66 and fills openings 72. Suitable metals include copper, aluminum, and the like. Preferably, the metal layer is copper. The copper layer is planarized using, for example, a CMP technique to remove the portions of the copper layer formed on dielectric layer 66. The portions of the copper layer filling openings 72 remain and form portions 67 of crack arrest structures 68. Portions 64 and 67 cooperate to form crack arrest structures 68. A layer of dielectric material 74 is formed on dielectric layer 66 and portions 67 of crack arrest structures 68. Preferably dielectric layer 74 is silicon nitride or the like having a thickness ranging between approximately 15 Å and approximately 800 Å. Silicon nitride layer 74 serves as a capping layer for crack arrest structures 68. A layer of dielectric material 76 is formed on nitride layer 74. By way of example, dielectric layer 76 has a thickness ranging between approximately 150 Å and approximately 8,000 Å. It should be understood that the types of material for dielectric layers 66, 74, and 76 are selected such that a layer of one type dielectric material is sandwiched between layers of a different type dielectric material. In other words, the dielectric material of layers 66 and 76 are preferably the same, e.g., oxide, and the dielectric material of layer 74 is a different type of dielectric material, e.g., nitride.

A layer of photoresist (not shown) is patterned on dielectric layer 76 to expose portions of dielectric layer 76. The exposed portions of dielectric layer 76 are removed using a reactive ion etch to form openings 82. Openings 82 extend through oxide layer 76, nitride layer 74, and into oxide layer 66. After removing the portions of oxide layer 76 to form openings 82, the etch chemistry of the reactive ion etch is changed to be selective to nitride, rather than oxide. However, once openings 82 extend through nitride layer 74, the etch chemistry is still capable of etching oxide. Thus, once openings 82 extend through nitride layer 74, the etch continues so that openings 82 extend into oxide layer 66. Because openings 82 terminate on oxide, rather than copper, the formation of openings 82 does not result in the sputtering of copper.

Figure 10:
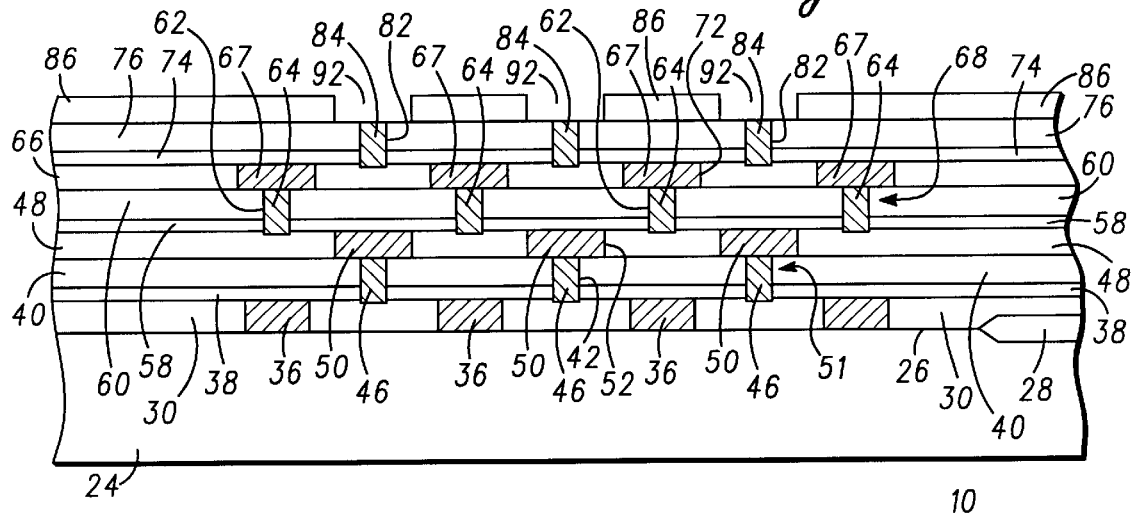

Now referring to FIG. 10, a layer of metal (not shown) is deposited on dielectric layer 76 and fills openings 82. Suitable metals include copper, aluminum, and the like. Preferably, the metal layer is copper. The copper layer is planarized using, for example, a CMP technique to remove the portions of the copper layer formed on dielectric layer 76. The portions of the copper layer filling openings 82 remain and form portions 84 of crack arrest structures 96. Crack arrest structures are further shown and described with reference to FIG. 11. A layer of dielectric material 86 is formed on dielectric layer 76. Preferably, the material of dielectric layer 86 is the same as the material of dielectric layer 76, e.g., oxide. By way of example, dielectric layer 86 has a thickness ranging between approximately 150 Å and approximately 8,000 Å. A layer of photoresist (not shown) is patterned on dielectric layer 86 to expose portions of dielectric layer 86. The exposed portions of dielectric layer 86 are removed using either a wet etch or a dry etch to form openings 92 that expose portions 84 of a crack arrest structure and portions of oxide layer 76 adjacent to portions 84 of crack arrest structures 96. After openings 92 have been formed, the layer of photoresist is removed.

Figure 11:
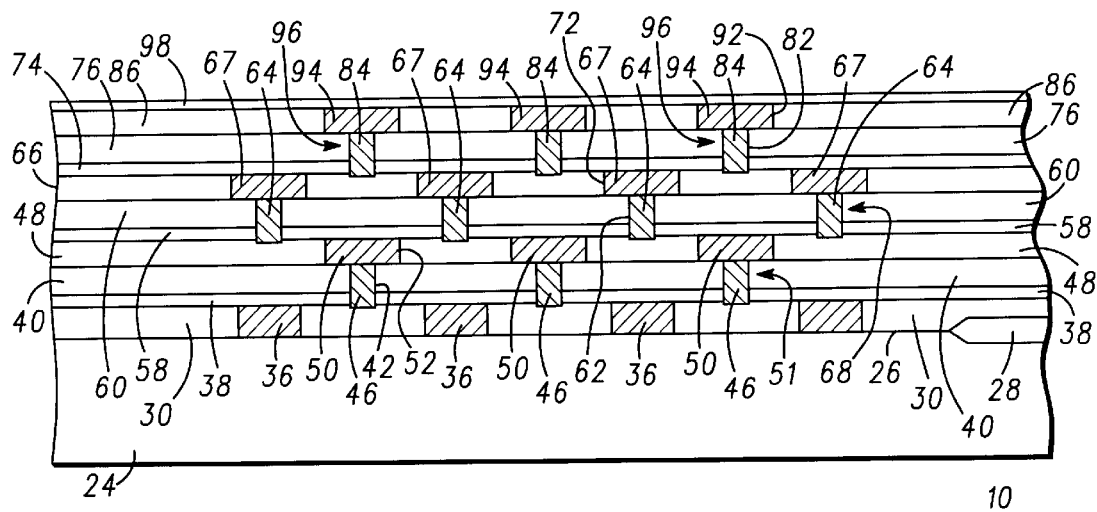

Now referring to FIG. 11, a layer of metal (not shown) is deposited on dielectric layer 86 and fills openings 92. Suitable metals include copper, aluminum, and the like. Preferably, the metal layer is copper. The copper layer is planarized using, for example, a CMP technique to remove the portions of the copper layer formed on dielectric layer 86. The portions of the copper layer filling openings 92 remain and form a portion 94 of a crack arrest structure. Portions 84 and 94 cooperate to form crack arrest structures 96. A layer of dielectric material 98 is formed on dielectric layer 86. Preferably, dielectric layer 98 is silicon nitride or the like having a thickness ranging between approximately 15 Å and approximately 800 Å. Silicon nitride layer 96 serves as a capping layer for crack arrest structures 96. Although scribe seal 10 is a four metal layer structure, this is not a limitation of the present invention. Scribe seals may include more than four metal layers or less than four metal layers.

Figure 12:
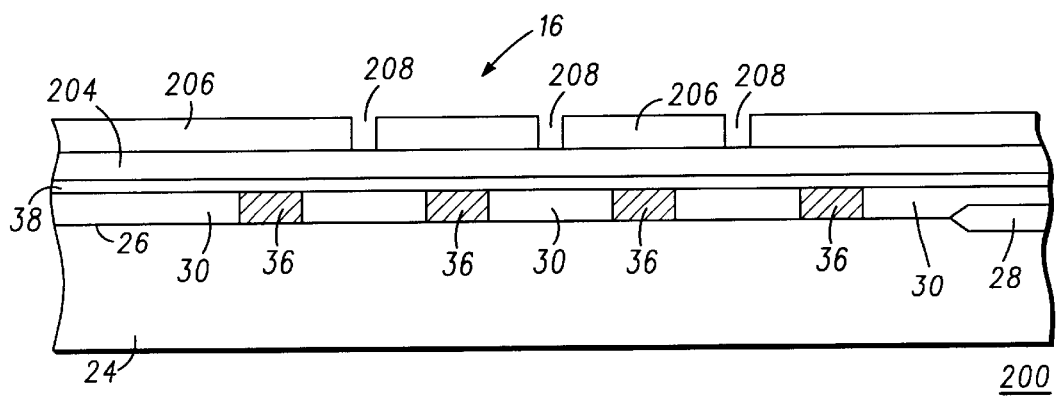
FIGS. 12–21 are cross-sectional side views of a scribe seal during fabrication in accordance with another embodiment of the present invention.

FIG. 12 is a cross-sectional side view of a semiconductor component 200 having a scribe seal region 16 in accordance with another embodiment of the present invention. In the embodiment described with references to FIGS. 12–21, the vias are formed prior to forming the trench vias, therefore the process is referred to as a via-first trench-last dual inlaid method. Scribe seal region 16 comprises a semiconductor substrate 24 having a major surface 26. Crack arrest structures 36 are formed on major surface 26 and separated by dielectric material 30. A layer of dielectric material 38 is disposed on dielectric material 30 and crack arrest structures 36. Formation of crack arrest structures 36 and dielectric layer 38 are described with reference to FIGS. 2–4. A layer of dielectric material 204 is formed on nitride layer 38. By way of example, dielectric layer 204 has a thickness ranging between approximately 150 Å and approximately 16,000 Å. Preferably, the type of dielectric material of dielectric layer 38 is different from the type of dielectric material of dielectric layer 204. For example, when dielectric layer 38 is nitride, dielectric layer 204 is oxide. Suitable materials for dielectric layer 38 include a nitride (SiN), silicon carbide nitride (SiCN), silicon carbide (SiC), and the like, whereas suitable materials for dielectric layer 204 include oxides or low dielectric constant (low κ) films such as, for example, SiCOH and SILK. A layer of photoresist 206 is patterned on oxide layer 204 to form openings 208 that expose portions of dielectric layer 204.

Figure 13:
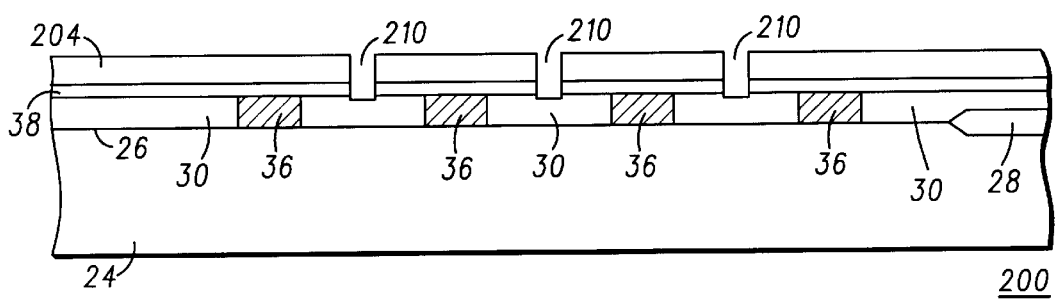

Referring now to FIG. 13, the exposed portions of dielectric layer 208 are removed using a reactive ion etch to form vias 210, which extend through oxide layer 204, nitride layer 38, and into oxide layer 30. After the portions of oxide layer 204 are etched to form vias 210, the etch chemistry of the reactive ion etch is changed to be selective to nitride, rather than oxide so that vias 210 extend through nitride layer 38. However, once vias 210 extend through nitride layer 38, the etch chemistry is still capable of etching oxide. Thus, once vias 210 extend through nitride layer 38, the etch continues so that vias 210 extend into oxide layer 30. Because vias 210 terminate on oxide, rather than copper, the formation of vias 210 does not result in the sputtering of copper. This is advantageous because sputtered copper would contaminate the reactive ion etch chamber as well as the semiconductor component. After formation of vias 210, photoresist layer 206 is removed using techniques known to those skilled in the art.

Figure 14:
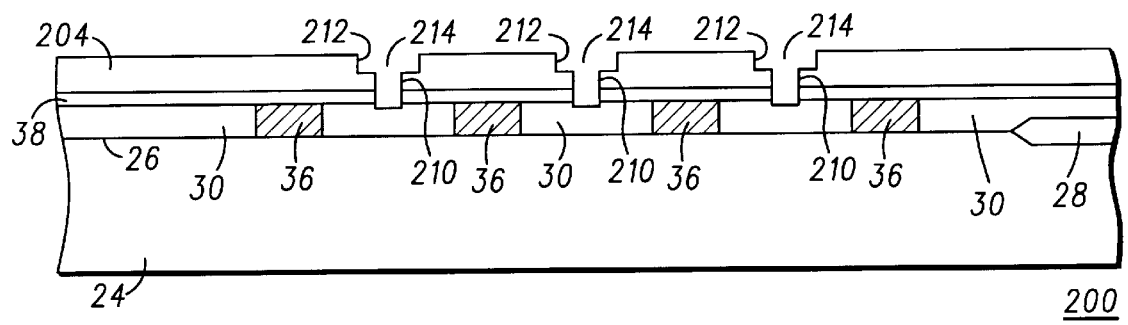

Referring now to FIG. 14, a layer of photoresist (not shown) is patterned on oxide layer 204 to form trench definition openings above vias 210. The exposed portions of dielectric layer 208 are removed using a reactive ion etch to form trench vias 212. Trench vias 212 cooperate with vias 210 to form crack arrest trench-via structures 214.

Figure 15:
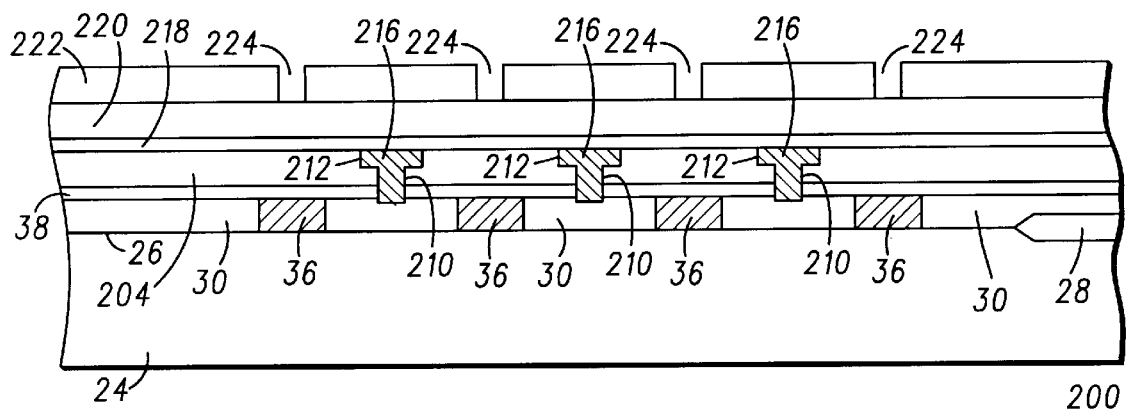

Referring now to FIG. 15, a layer of metal (not shown) is deposited on oxide layer 204 and fills crack arrest trench-via structures 214. Suitable metals include copper, aluminum, and the like. Preferably, the metal layer is copper.

Still referring to FIG. 15, the copper layer is planarized using, for example, a CMP technique to remove the portions of the copper layer formed on dielectric layer 204. The portions of the copper layer filling crack arrest trench-via structures 214 remain and form crack arrest structures or stress-defect inhibitors 216. A layer of dielectric material 218 is formed on dielectric layer 204 and crack arrest structures 216. Preferably dielectric layer 218 is silicon nitride or the like having a thickness ranging between approximately 15 Å and approximately 800 Å. Nitride layer 218 serves as a capping layer for crack arrest structures 216. A layer of dielectric material 220 is formed on nitride layer 218. By way of example, dielectric layer 220 has a thickness ranging between approximately 150 Å and approximately 16,000 Å. Preferably, the type of dielectric material of dielectric layer 218 is different from the type of dielectric material of dielectric layer 220. For example, when dielectric layer 218 is nitride, dielectric layer 220 is oxide. Suitable materials for dielectric layer 218 include a nitride (SiN), silicon carbide nitride (SiCN), silicon carbide (SiC), and the like, whereas suitable materials for dielectric layer 220 include oxides or low dielectric constant (low κ) films such as, for example, SiCOH and SILK. A layer of photoresist 222 is patterned on oxide layer 220 to form openings 224 that expose portions of dielectric layer 220.

Figure 16:
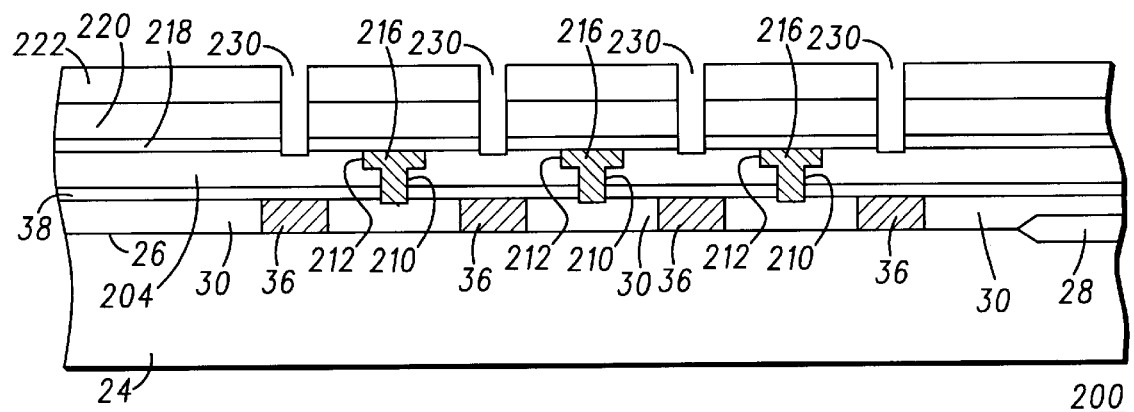

Referring now to FIG. 16, the exposed portions of dielectric layer 220 are removed using a reactive ion etch to form vias 230, which extend through oxide layer 220, nitride layer 218, and into oxide layer 204. After the portions of oxide layer 220 are etched to form vias 230, the etch chemistry of the reactive ion etch is changed to be selective to nitride, rather than oxide so that vias 230 extend through nitride layer 218. However, once vias 230 extend through nitride layer 218, the etch chemistry is still capable of etching oxide. Thus, once vias 230 extend through nitride layer 218, the etch continues so that vias 230 extend into oxide layer 204. Because vias 230 terminate on oxide, rather than copper, the formation of vias 230 does not result in the sputtering of copper. This is advantageous because sputtered copper would contaminate the reactive ion etch chamber as well as the semiconductor component. After formation of vias 230, photoresist layer 222 is removed using techniques known to those skilled in the art.

Figure 17:
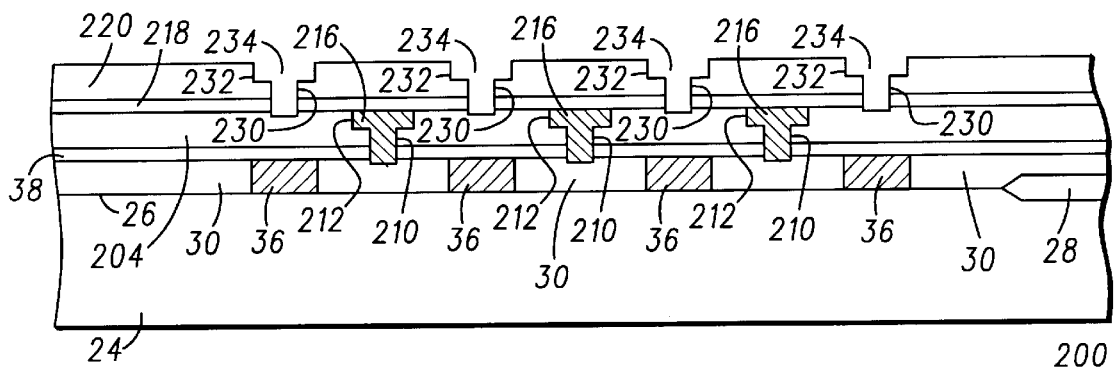

Referring now to FIG. 17, a layer of photoresist (not shown) is patterned on oxide layer 220 to form trench definition openings above vias 230. The exposed portions of dielectric layer 220 are removed using a reactive ion etch to form trench vias 232. Trench vias 232 cooperate with vias 230 to form crack arrest trench-via structures 234.

Figure 18:
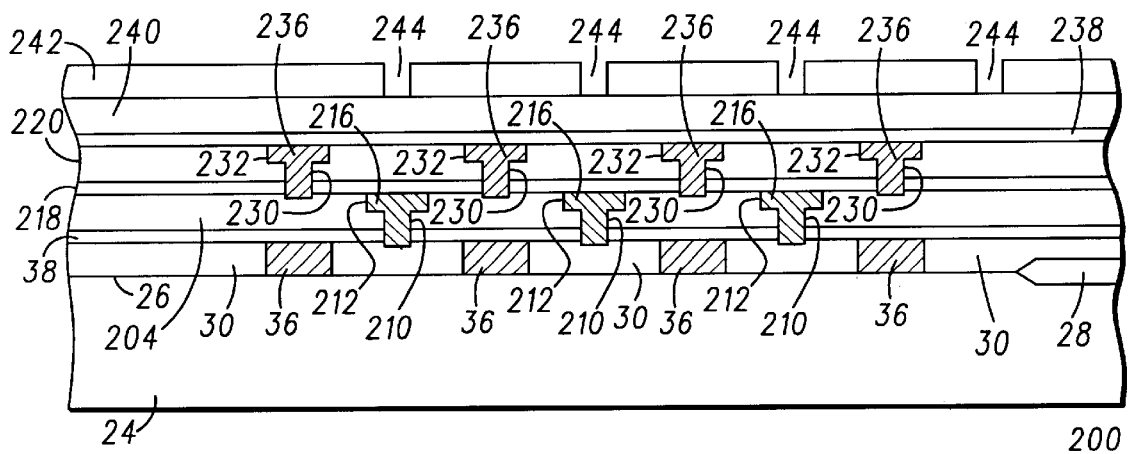

Referring now to FIG. 18, a layer of metal (not shown) is deposited on oxide layer 220 and fills crack arrest trench-via structures 234. Suitable metals include copper, aluminum, and the like. Preferably, the metal layer is copper.

Still referring to FIG. 18, the copper layer is planarized using, for example, a CMP technique to remove the portions of the copper layer formed on dielectric layer 220. The portions of the copper layer filling crack arrest trench-via structures 234 remain and form crack arrest structures or stress-defect inhibitors 236. A layer of dielectric material 238 is formed on dielectric layer 220 and crack arrest structures 236. Preferably dielectric layer 238 is silicon nitride or the like having a thickness ranging between approximately 15 Å and approximately 800 Å. Silicon nitride layer 238 serves as a capping layer for crack arrest structures 236. A layer of dielectric material 240 is formed on nitride layer 238. By way of example, dielectric layer 240 has a thickness ranging between approximately 150 Å and approximately 16,000 Å. Preferably, the type of dielectric material of dielectric layer 238 is different from the type of dielectric material of dielectric layer 240. For example, when dielectric layer 238 is nitride, dielectric layer 240 is oxide. Suitable materials for dielectric layer 238 include a nitride (SiN), silicon carbide nitride (SiCN), silicon carbide (SiC), and the like, whereas suitable materials for dielectric layer 240 include oxides or low dielectric constant (low κ) films such as, for example, SiCOH and SILK. A layer of photoresist 242 is patterned on oxide layer 240 to form openings 244 that expose portions of dielectric layer 240.

Figure 19:
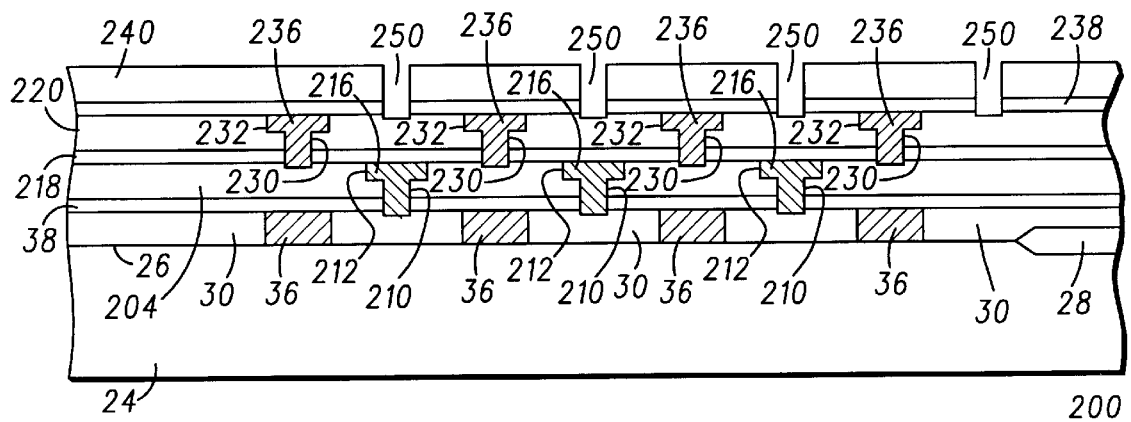

Referring now to FIG. 19, the exposed portions of dielectric layer 240 are removed using a reactive ion etch to form vias 250, which extend through oxide layer 240, nitride layer 238, and into oxide layer 240. After the portions of oxide layer 240 are etched to form vias 250, the etch chemistry of the reactive ion etch is changed to be selective to nitride, rather than oxide so that vias 250 extend through nitride layer 238. However, 9once vias 250 extend through nitride layer 238, the etch chemistry is still capable of etching oxide. Thus, once vias 250 extend through nitride layer 238, the etch continues so that vias 250 extend into oxide layer 220. Because vias 250 terminate on oxide, rather than copper, the formation of vias 250 does not result in the sputtering of copper. This is advantageous because sputtered copper would contaminate the reactive ion etch chamber as well as the semiconductor component. After formation of vias 250, photoresist layer 242 is removed using techniques known to those skilled in the art.

Figure 20:
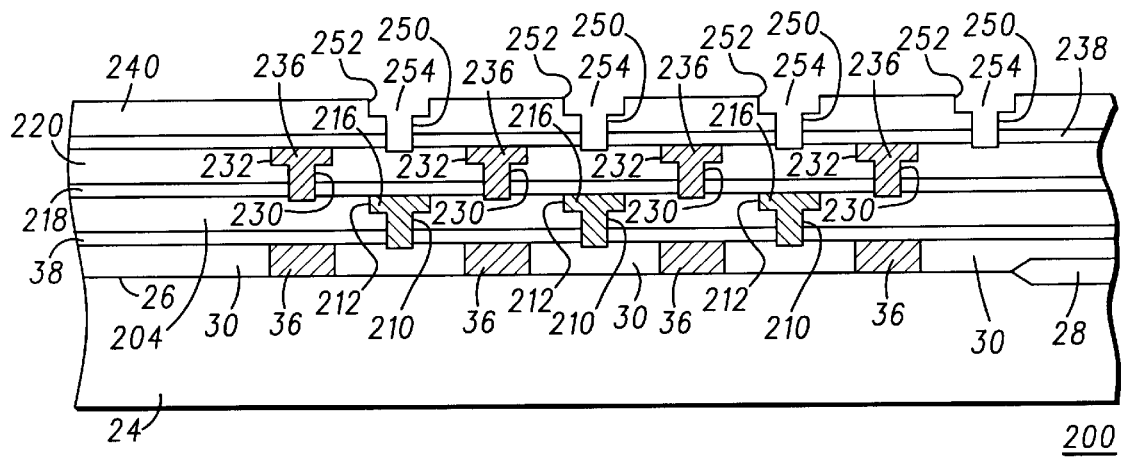

Referring now to FIG. 20, a layer of photoresist (not shown) is patterned on oxide layer 240 to form trench definition openings above vias 250. The exposed portions of dielectric layer 240 are removed using a reactive ion etch to form trench vias 252. Trench vias 252 cooperate with vias 250 to form crack arrest trench-via structures 254.

Figure 21:
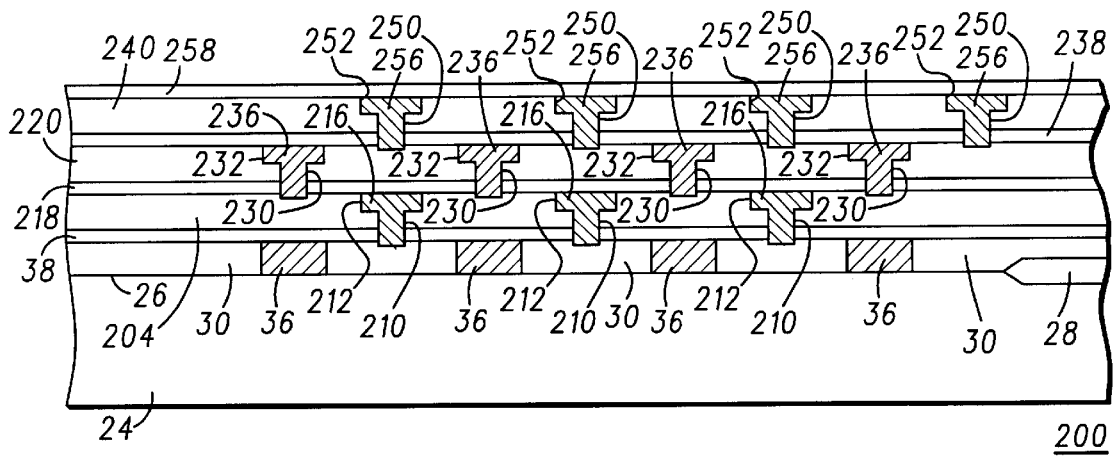

Referring now to FIG. 21, a layer of metal (not shown) is deposited on oxide layer 240 and fills crack arrest trench-via structures 254. Suitable metals include copper, aluminum, and the like. Preferably, the metal layer is copper.

Still referring to FIG. 21, the copper layer is planarized using, for example, a CMP technique to remove the portions of the copper layer formed on dielectric layer 240. The portions of the copper layer filling crack arrest trench-via structures 254 remain and form crack arrest structures or stress-defect inhibitors 256. A layer of dielectric material 258 is formed on dielectric layer 240 and crack arrest structures 256. Preferably dielectric layer 258 is silicon nitride or the like having a thickness ranging between approximately 15 Å and approximately 800 Å. Nitride layer 258 serves as a capping layer for crack arrest structures 236. Although scribe seal 200 is a four metal layer structure, this is not a limitation of the present invention. Scribe seals may include more than four metal layers or less than four metal layers.

Figure 22:
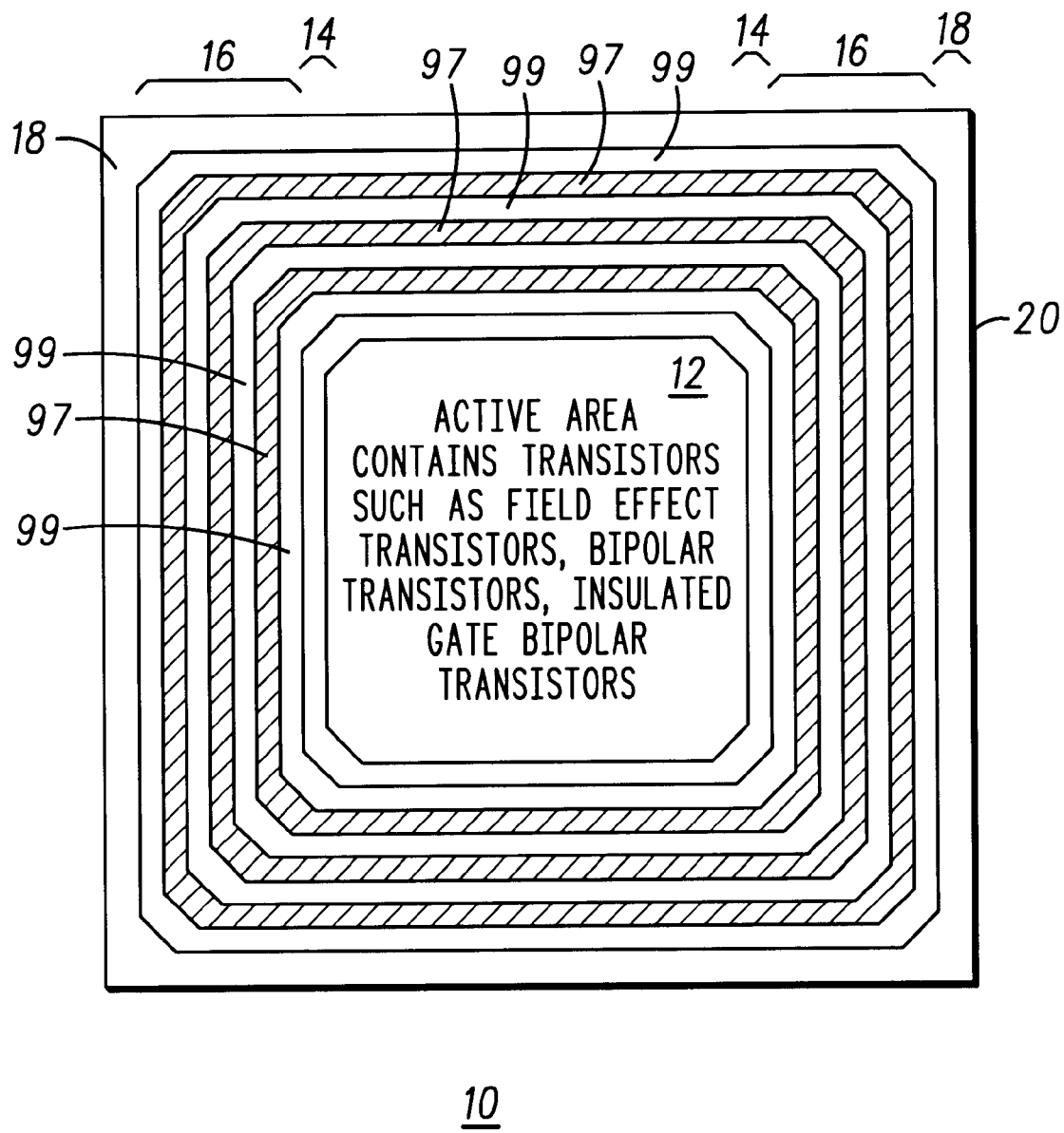
FIG. 22 is a top view of a semiconductor component including the scribe seal in accordance with an embodiment of the present invention.

Referring now to FIG. 22, a top view of a semiconductor component is shown prior to the formation of a nitride cap layer. What is shown in FIG. 22 is a semiconductor dice or chip bounded by scribe lines 20. Scribe seal region 16 is separated from scribe line 20 by buffer area 18 and from active device region 12 by buffer area 14. Scribe seal 22 is formed in scribe seal region 16 and preferably is formed contemporaneously with a semiconductor component having four metal layers. It should be understood the number of metal layers is not a limitation of the present invention. In accordance with one embodiment of the present invention, portions 94 are fabricated from the fourth metal layer and are horizontally coplanar. Portions 84 are also horizontally coplanar, thus crack arrest structures 96 are horizontally coplanar. Portions 50 of crack arrest structures 51 are fabricated from the second metal layer and are horizontally coplanar. Portions 46 are also horizontally coplanar, thus crack arrest structures 51 are horizontally coplanar. Regions 97 in FIG. 22 illustrate portions 94 of crack arrest structures 96; however, crack arrest structures 51 are below or in vertical alignment with crack arrest structures 96 and thus are hidden from view.

Portions 67 are fabricated from the third metal layer and are horizontally coplanar. Portions 64 are also horizontally coplanar, thus crack arrest structures 68 are horizontally coplanar. Crack arrest structures 36 are fabricated from the first layer of metal and are horizontally coplanar. Crack arrest structures 36 are below and in vertical alignment with crack arrest structures 68. In this embodiment of the present invention, regions 99 in FIG. 22 illustrate where crack arrest structures 68 are positioned laterally relative to crack arrest structures 96. Because crack arrest structures 68 are below three layers of dielectric material, i.e., oxide layers 76 and 86 and nitride layer 74, they are shielded from view in FIG. 22. Thus, regions 99 have been distinguished from regions 97 by omitting the cross-hatches in region 99.

In accordance with another embodiment of the present invention, crack arrest structures 256 are fabricated from the fourth metal layer and are horizontally coplanar. Crack arrest structures 216 are fabricated from the second metal layer and are horizontally coplanar. Crack arrest structures 216 are below and vertically aligned to crack arrest structures 256, and thus are hidden from view. Crack arrest structures 236 are fabricated from the third metal layer and are horizontally coplanar. Crack arrest structures 36 are fabricated from the first metal layer and are horizontally coplanar. Crack arrest structures 36 are below and vertically aligned to crack arrest structures 236, and thus are hidden from view. In this embodiment of the present invention, regions 99 in FIG. 22 illustrate where crack arrest structures 236 are positioned laterally relative to crack arrest structures 256. Because crack arrest structures 236 are below two layers of dielectric material, i.e., oxide layer 240 and nitride layer 238, they are shielded from view in FIG. 22. Thus, regions 99 have been distinguished from regions 97 by omitting the cross-hatches in region 99.

By now it should be appreciated that a scribe seal and a method for fabricating the scribe seal and a semiconductor component have been provided. An advantage of the present invention is that formation of the scribe seals does not require forming vias or openings directly over copper crack arrest structures. This eliminates fabrication steps that cause copper to be sputtered, thereby eliminating a source of copper contamination.

Although certain preferred embodiments and methods have been disclosed herein, it will be apparent from the foregoing disclosure to those skilled in the art that variations and modifications of such embodiments and methods may be made without departing from the spirit and scope of the invention. For example, rather than first forming vias then forming trench vias, i.e., using a via-first trench-last dual inlaid method, the trench vias are formed first and then the vias are formed last, i.e., a trench-first via-last dual inlaid method. Further, the scribe seal can be formed on any suitable substrate including dielectric substrates. It is intended that the invention shall be limited only to the extent required by the appended claims and the rules and principles of applicable law.

What is claimed is:

1. A method for manufacturing a scribe seal, comprising:
providing a substrate having a major surface;
disposing a first layer of dielectric material on a portion of the major surface;

forming a first opening in the first layer of dielectric material;

filling the first opening with a crack arresting material;

disposing a second layer of dielectric material on the crack arresting material and the first layer of dielectric material;

forming a second opening in the second layer of dielectric material by forming a via extending into the second layer of dielectric material and forming a trench via extending into the second layer of dielectric material wherein the via and the trench via cooperate to form the second opening, wherein the second opening is laterally spaced apart from the first opening and exposing a portion of the first layer of dielectric material; and filling the second opening with the crack arresting material.

2. The method of claim 1, wherein the crack arresting material is a material selected from the group consisting of copper and aluminum.

3. The method of claim 1, further including disposing a third layer of dielectric material on the crack arresting material in the second opening.

4. The method of claim 1, wherein forming the first opening comprises forming a trench in the first layer of dielectric material.

5. The method of claim 4, wherein forming the first opening comprises etching the first layer of dielectric material.

6. The method of claim 1, wherein forming the second opening comprises etching the second layer of dielectric material.

7. The method of claim 1, wherein the via is formed before the trench via is formed.

8. The method of claim 1, wherein the trench via is formed before the via is formed.

9. The method of claim 1, further including forming a capping layer over the first layer of dielectric material.

* * * * *